(12) United States Patent
Yu et al.

(10) Patent No.: US 9,230,902 B2
(45) Date of Patent: *Jan. 5, 2016

(54) INTERCONNECT STRUCTURE FOR WAFER LEVEL PACKAGE

(71) Applicant: Taiwan Semiconductor Manufacturing Company, Ltd., Hsin-Chu (TW)

(72) Inventors: Chen-Hua Yu, Hsin-Chu (TW); Jing-Cheng Lin, Chu Tung Zhen (TW); Nai-Wei Liu, Fengshan (TW); Jui-Pin Hung, Hsin-Chu (TW); Shin-Puu Jeng, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/448,356

(22) Filed: Jul. 31, 2014

(65) Prior Publication Data

US 2014/0339696 A1 Nov. 20, 2014

Related U.S. Application Data

(63) Continuation of application No. 13/170,973, filed on Jun. 28, 2011, now Pat. No. 8,829,676.

(51) Int. Cl.
*H01L 23/485* (2006.01)
*H01L 23/498* (2006.01)
(Continued)

(52) U.S. Cl.
CPC ........ *H01L 23/49838* (2013.01); *H01L 21/561* (2013.01); *H01L 21/568* (2013.01); *H01L 21/78* (2013.01); *H01L 23/481* (2013.01); *H01L 24/11* (2013.01); *H01L 24/13* (2013.01); *H01L 24/19* (2013.01); *H01L 23/3128* (2013.01); *H01L 2224/0401* (2013.01); *H01L 2224/04105* (2013.01); *H01L 2224/05008* (2013.01); *H01L 2224/05569* (2013.01); *H01L 2224/05572* (2013.01); *H01L 2224/12105* (2013.01); *H01L 2224/131* (2013.01); *H01L 2224/13022* (2013.01); *H01L 2224/13025* (2013.01);

(Continued)

(58) Field of Classification Search
CPC ............... H01L 2924/00014; H01L 2924/014; H01L 2924/15311; H01L 2224/32225; H01L 2224/16225; H01L 24/12
See application file for complete search history.

(56) References Cited

U.S. PATENT DOCUMENTS 5,870,289 A * 2/1999 Tokuda et al. ................ 361/779
5,902,686 A 5/1999 Mis (Continued)

*Primary Examiner* — Zandra Smith
*Assistant Examiner* — Jaehwan Oh
(74) *Attorney, Agent, or Firm* — Slater & Matsil, L.L.P.

(57) ABSTRACT

A package includes a device die having a substrate. A molding compound contacts a sidewall of the substrate. A metal pad is over the substrate. A passivation layer has a portion covering an edge portion of the metal pad. A metal pillar is over and contacting the metal pad. A dielectric layer is over the passivation layer. A package material formed of a molding compound or a polymer is over the dielectric layer. The dielectric layer includes a bottom portion between the passivation layer and the package material, and a sidewall portion between a sidewall of the metal pillar and a sidewall of the package material. A polymer layer is over the package material, the molding compound, and the metal pillar. A post-passivation interconnect (PPI) extends into the polymer layer. A solder ball is over the PPI, and is electrically coupled to the metal pad through the PPI.

20 Claims, 16 Drawing Sheets

(51) Int. Cl.
  H01L 21/56 (2006.01)
  H01L 23/00 (2006.01)
  H01L 21/78 (2006.01)
  H01L 23/48 (2006.01)
  H01L 23/31 (2006.01)

(52) U.S. Cl.
  CPC ........... *H01L2224/13147* (2013.01); *H01L 2224/73267* (2013.01); *H01L 2224/96* (2013.01); *H01L 2924/00014* (2013.01); *H01L 2924/014* (2013.01); *H01L 2924/01029* (2013.01); *H01L 2924/0132* (2013.01)

(56) References Cited

U.S. PATENT DOCUMENTS

| | | | | |
|---|---|---|---|---|
| 6,433,427 | B1* | 8/2002 | Wu et al. | 257/737 |
| 6,515,369 | B1* | 2/2003 | Lin | 257/773 |
| 6,528,349 | B1* | 3/2003 | Patel et al. | 438/117 |
| 6,746,898 | B2* | 6/2004 | Lin et al. | 438/113 |
| 6,972,964 | B2* | 12/2005 | Ho et al. | 361/761 |
| 7,170,162 | B2* | 1/2007 | Chang | 257/700 |
| 7,276,783 | B2* | 10/2007 | Goller et al. | 257/678 |
| 7,368,374 | B2* | 5/2008 | Chia et al. | 438/613 |
| 7,397,000 | B2* | 7/2008 | Shimoto et al. | 174/258 |
| 7,485,956 | B2* | 2/2009 | Tuckerman et al. | 257/704 |
| 7,498,196 | B2* | 3/2009 | Lee et al. | 438/108 |
| 7,755,151 | B2* | 7/2010 | Lim et al. | 257/416 |
| 7,863,721 | B2* | 1/2011 | Suthiwongsunthorn et al. | 257/686 |
| 7,883,991 | B1 | 2/2011 | Wu et al. | |
| 7,906,860 | B2* | 3/2011 | Meyer et al. | 257/790 |
| 8,003,512 | B2* | 8/2011 | Belanger et al. | 438/612 |
| 8,008,125 | B2* | 8/2011 | McConnelee et al. | 438/109 |
| 8,039,315 | B2* | 10/2011 | Lee et al. | 438/113 |
| 8,114,708 | B2* | 2/2012 | McConnelee et al. | 438/109 |
| 8,163,596 | B2 | 4/2012 | Kapusta et al. | |
| 8,178,435 | B2* | 5/2012 | Lin | 438/622 |
| 8,187,965 | B2* | 5/2012 | Lin et al. | 438/617 |
| 8,216,881 | B2* | 7/2012 | Beer et al. | 438/112 |
| 8,258,624 | B2* | 9/2012 | Beer et al. | 257/737 |
| 8,373,272 | B2* | 2/2013 | Liu et al. | 257/758 |
| 8,580,614 | B2 | 11/2013 | Yu et al. | |
| 2002/0064922 | A1* | 5/2002 | Lin | 438/381 |
| 2002/0093107 | A1* | 7/2002 | Wu et al. | 257/780 |
| 2003/0017647 | A1* | 1/2003 | Kwon et al. | 438/109 |
| 2003/0071326 | A1* | 4/2003 | Lin | 257/531 |
| 2003/0092274 | A1* | 5/2003 | Brintzinger | 438/694 |
| 2004/0232543 | A1* | 11/2004 | Goller et al. | 257/700 |
| 2007/0170577 | A1* | 7/2007 | Dangelmaier et al. | 257/693 |
| 2007/0236859 | A1* | 10/2007 | Borland et al. | 361/272 |
| 2007/0267743 | A1* | 11/2007 | Mizusawa et al. | 257/734 |
| 2007/0290379 | A1* | 12/2007 | Dueber et al. | 257/792 |
| 2007/0291440 | A1* | 12/2007 | Dueber et al. | 361/301.3 |
| 2008/0150121 | A1 | 6/2008 | Oganesian et al. | |
| 2009/0020864 | A1* | 1/2009 | Pu et al. | 257/687 |
| 2009/0243081 | A1* | 10/2009 | Kapusta et al. | 257/693 |
| 2009/0289356 | A1* | 11/2009 | Camacho et al. | 257/737 |
| 2009/0309235 | A1* | 12/2009 | Suthiwongsunthorn et al. | 257/777 |
| 2010/0193949 | A1* | 8/2010 | Belanger et al. | 257/738 |
| 2010/0207265 | A1 | 8/2010 | Muthukumar et al. | |
| 2011/0198762 | A1 | 8/2011 | Scanlan | |
| 2012/0028411 | A1 | 2/2012 | Yu et al. | |
| 2012/0043654 | A1* | 2/2012 | Lu et al. | 257/737 |
| 2012/0043655 | A1* | 2/2012 | Khor et al. | 257/738 |
| 2012/0103475 | A1* | 5/2012 | Kim | 148/276 |
| 2012/0119378 | A1 | 5/2012 | Ng et al. | |
| 2014/0264930 | A1 | 9/2014 | Yu et al. | |

* cited by examiner

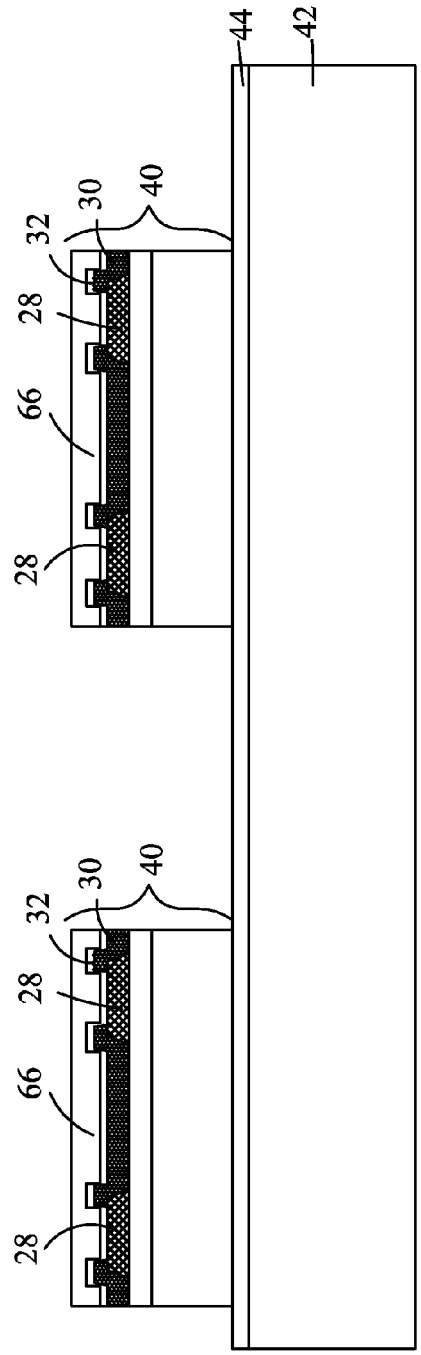
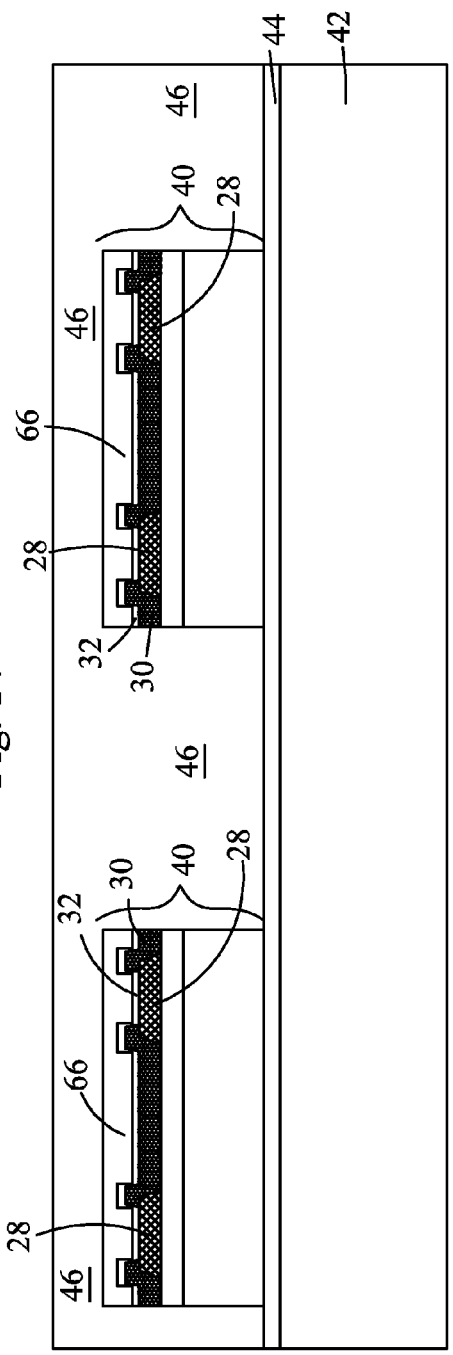

INTERCONNECT STRUCTURE FOR WAFER LEVEL PACKAGE

This application is a continuation of U.S. application Ser. No. 13/170,973, filed on Jun. 28, 2011, entitled "Interconnect Structure for Wafer Level Package," which application is incorporated by reference herein.

BACKGROUND

With the evolving of semiconductor technologies, semiconductor dies are becoming increasingly smaller. More functions, however, need to be integrated into the semiconductor dies. Accordingly, the semiconductor dies need to have increasingly greater numbers of I/O pads packaged into smaller areas, and the density of the I/O pads rises quickly. As a result, the packaging of the semiconductor dies becomes more difficult, and adversely affecting the yield.

Package technologies can be divided into two categories. One category is typically referred to as wafer level package (WLP), wherein the dies on a wafer are packaged before they are sawed. The WLP technology has some advantageous features, such as a greater throughput and a lower cost. Further, less underfill or molding compound is needed. However, the WLP technology suffers from drawbacks. The conventional WLP can only be fan-in type packages, in which the I/O pads of each die are limited to a region directly over the surface of the respective die. With the limited areas of the dies, the number of the I/O pads is limited due to the limitation of the pitch of the I/O pads. If the pitch of the pads is to be decreased, solder bridges may occur. Additionally, under the fixed ball-size requirement, solder balls must have a certain size, which in turn limits the number of solder balls that can be packed on the surface of a die.

In the other category of packaging, dies are sawed from wafers before they are packaged onto other wafers, and only "known-good-dies" are packaged. An advantageous feature of this packaging technology is the possibility of forming fan-out chip packages, which means the I/O pads on a die can be redistributed to a greater area than the die itself, and hence the number of I/O pads packed on the surfaces of the dies can be increased.

The formation of fan-out WLP faces challenges. For example, the formation of the fan-out WLP involves various materials whose characteristics have significant difference. Accordingly, the adhesion strength at the interfaces of these materials needs to be improved. The moisture isolation of the fan-out WLP needs to be improved. Furthermore, the inter-diffusion and out-gassing between the materials involved in the fan-out WLP need to be controlled.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 13 through 19 are cross-sectional views of intermediate stages in the manufacturing of a fan-out wafer level package (WLP) in accordance with an alternative embodiment, wherein a dielectric layer and a polyimide layer are formed over the metal pads of a device wafer before the device wafer is sawed, and wherein a via-last approach is used to package the dies sawed from the device wafer.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A fan-out wafer level package (WLP) structure and methods of forming the same are provided. The intermediate stages of manufacturing a WLP structure are illustrated in accordance with various embodiments. Throughout the various views and illustrative embodiments of the present invention, like reference numbers are used to designate like elements.

Figure 1:
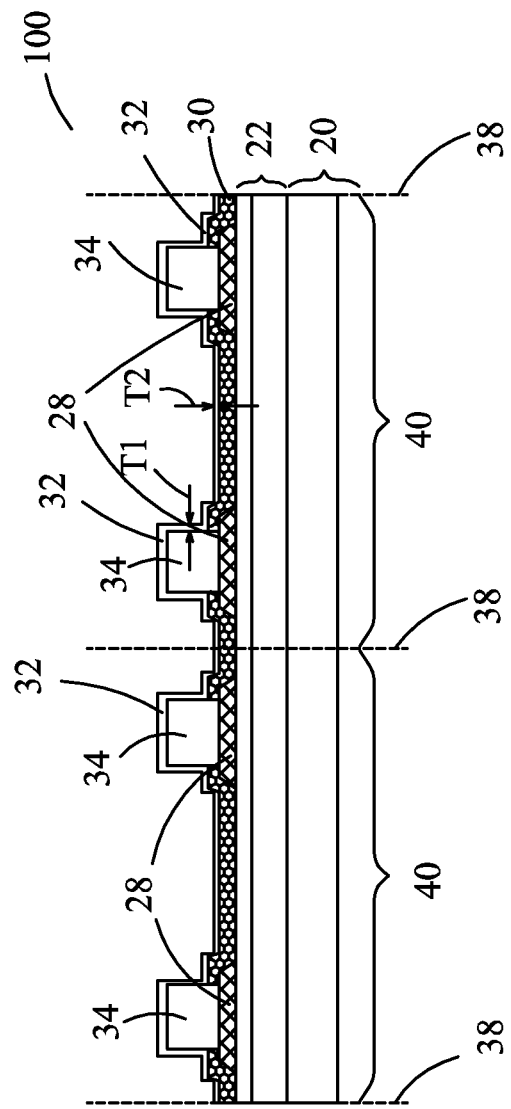
FIGS. 1 through 6 are cross-sectional views of intermediate stages in the manufacturing of a fan-out wafer level package (WLP) in accordance with an embodiment, wherein a dielectric layer is formed over the metal pads in a device wafer before the device wafer is sawed, and wherein a via-first approach is used to package the dies sawed from the device wafer.

Referring to FIG. 1, device wafer 100 is provided. Wafer 100 includes substrate 20, which may be a semiconductor substrate, such as a silicon substrate, although it may be formed of other semiconductor materials, such as silicon germanium, silicon carbon, gallium arsenide, or the like. Semiconductor devices (not shown), such as transistors, may be formed at the surface of substrate 20. Interconnect structure 22, which includes metal lines and vias (not shown) formed therein and electrically coupled to the semiconductor devices, is formed over substrate 20. The metal lines and vias may be formed of copper or copper alloys, and may be formed using damascene processes. Interconnect structure 22 may include an inter-layer dielectric (ILD) and inter-metal dielectrics (IMDs).

Metal pads 28 are formed over interconnect structure 22. Metal pads 28 may comprise aluminum (Al), copper (Cu), silver (Ag), gold (Au), nickel (Ni), tungsten (W), alloys thereof, and/or multi-layers thereof. In an exemplary embodiment, metal pads 28 are formed of aluminum copper. Metal pads 28 may be electrically coupled to the semiconductor devices, for example, through the underlying interconnect structure 22. Passivation layer 30 may be formed to cover the edge portions of metal pads 28. In an exemplary embodiment, passivation layer 30 is formed of a silicon oxide layer, and a silicon nitride layer over the silicon oxide layer, although other dielectric materials such as un-doped silicate glass (USG), silicon oxynitride, and the like, may be used.

Metal pillars 34 are formed over, and may be in physical contact with, metal pads 28. Metal pillars 34 extend into the openings in passivation layer 30, and the edges of metal pillars 34 may contact the edges of passivation layer 30. In an embodiment, metal pillars 34 comprise copper or copper alloys, although other metals or metal alloys may be used. The top surfaces of metal pillars 34 may be higher than the top surfaces of passivation layer 30, so that metal pillars 34 protrude over passivation layer 30.

Dielectric layer 32 is formed over passivation layer 30 and metal pillars 34. Dielectric layer 32 may have a bottom surface contacting the top surface of passivation layer 30, the top surfaces of metal pillars 34, and the sidewalls of metal pillars 34. The materials of dielectric layer 32 include, but are not limited to, silicon nitride, silicon carbide, silicon carbonitride, silicon oxycarbide, tetra-ethyl-ortho-silicate (TEOS) oxide, silicon oxide, multi-layers thereof, and/or combinations thereof. The thickness of dielectric layer 32 may be smaller than about 1 μm, and may be between about 0.1 μm and about 1 μm, for example, although different thicknesses may be used. Dielectric layer 32 may be substantially conformal, for example, with the thickness T1 of the vertical portions of dielectric layer 32 being close to thickness T2 of the horizontal portions. For example, thickness T1 may be between about 70 percent and 100 percent thickness T2. After the formation of dielectric layer 32, and without performing patterning to dielectric layer 32, device wafer 100 may be sawed along scribe lines 38, and hence device dies 40 are separated from wafer 100. At the time the die saw is performed, dielectric layer 32 may be the topmost layer that covers the entire wafer 100, and may be exposed to open air. Accordingly, dielectric layer 32 may prevent moisture from oxidizing and degrading metal pillars 34.

Figure 2:
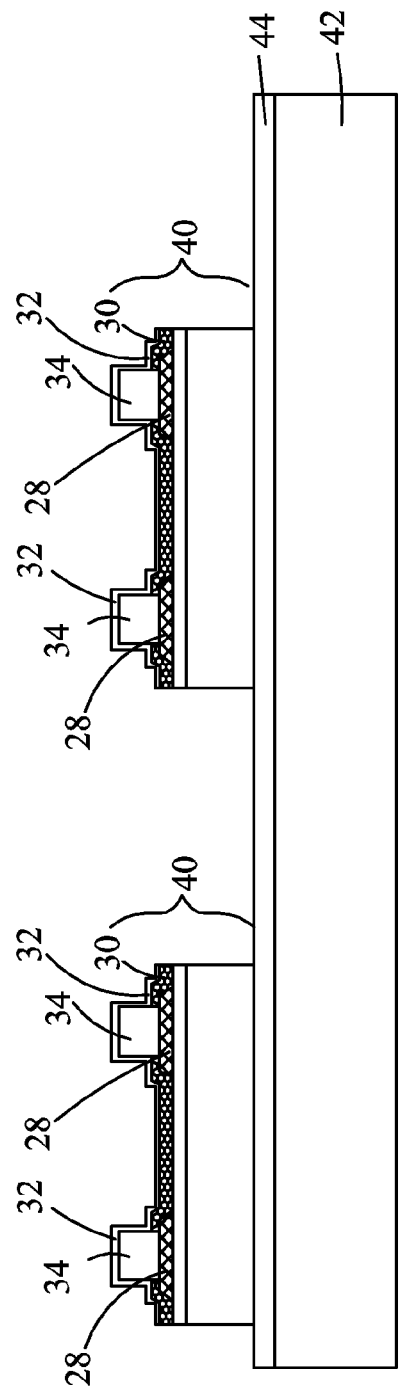
Figure 3:
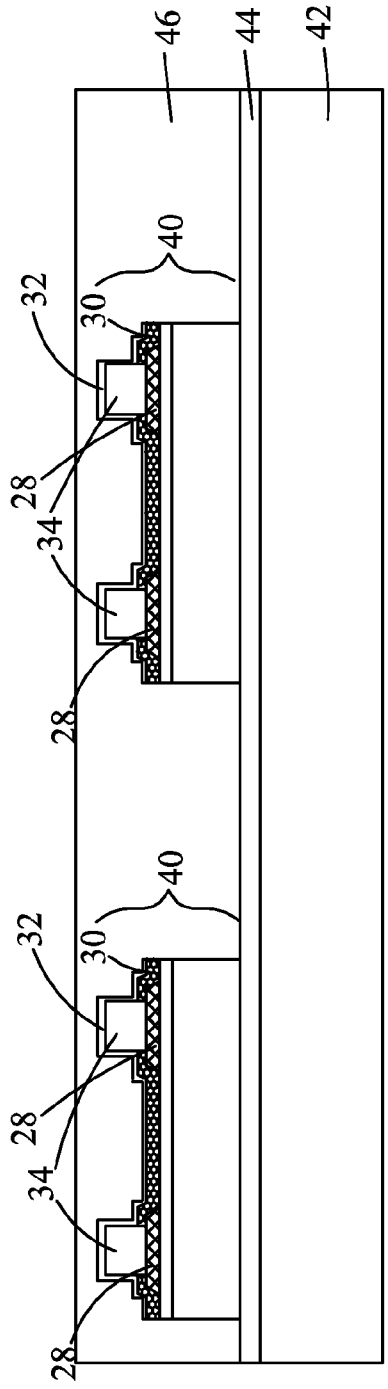

Next, as shown in FIG. 2, dies 40 are attached on carrier 42, for example, through adhesive 44. Referring to FIG. 3, molding compound 46 is applied to fill the gaps between dies 40, and to cover dies 40. In an embodiment, molding compound 46 contacts the sidewalls of substrate 20, the top surface and side edges of dielectric layer 32, and the side edges of passivation layer 30. The top surface of molding compound 46 may be higher than the top surfaces of dielectric layer 32. Molding compound 46 is then cured.

Figure 4:
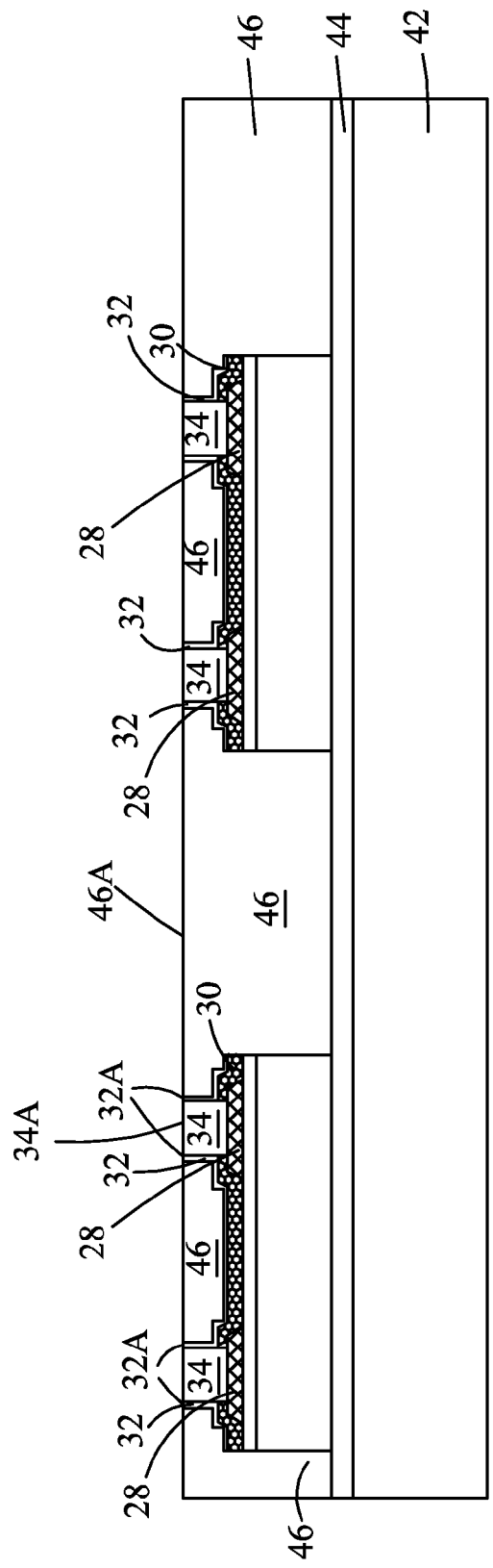
Figure 5:
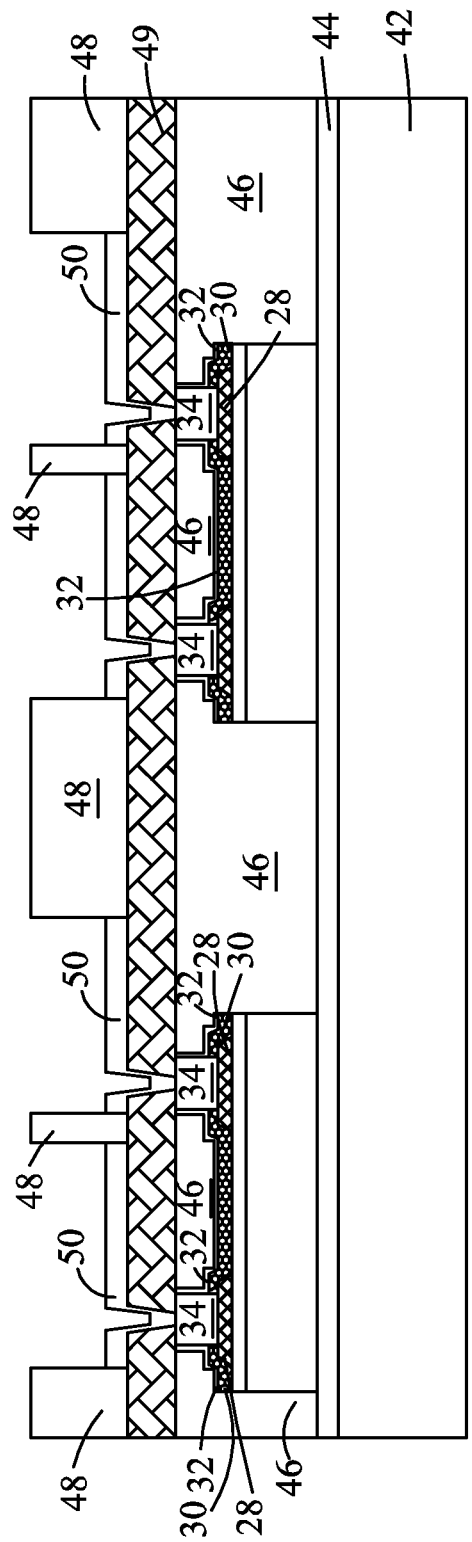

Next, as shown in FIG. 4, a grinding is performed, until the top surfaces of metal pillars 34 are exposed. Accordingly, the portions of dielectric layer 32 and molding compound 46 that are over the top surfaces of metal pillars 34 are removed. As a result of the grinding, top edges 32A of dielectric layer 32 are level with top surfaces 46A of molding compound 46, and are level with top surfaces 34A of metal pillars 34. FIG. 5 illustrates the formation of polymer layer 49 and post-passivation interconnects (PPIs) 50. Polymer layer 49 may be a polyimide layer, and hence is referred to as polyimide layer 49 throughout the description. Polyimide layer 49 may be formed of a photo-sensitive material, which can be patterned easily to form openings, through which the underlying metal pillars 34 are exposed. In an exemplary embodiment, polyimide layer 49 is formed of low-temperature polybenzoxazole (PBO). Mask layer 48 is then formed over polyimide layer 49. Mask layer 48 may be formed of a photo resist, and hence is alternatively referred to as photo resist 48 throughout the description, although other materials may be used. Next, a plating step is performed to form PPIs 50 in the openings in photo resist 48. PPIs 50 may be formed of copper or copper alloys, and may include PPI lines and PPI pads. PPIs 50 may extend into the openings in polyimide layer 49 to electrically connect to metal pillars 34. PPIs 50 may also be in contact with metal pillars 34.

Figure 6:
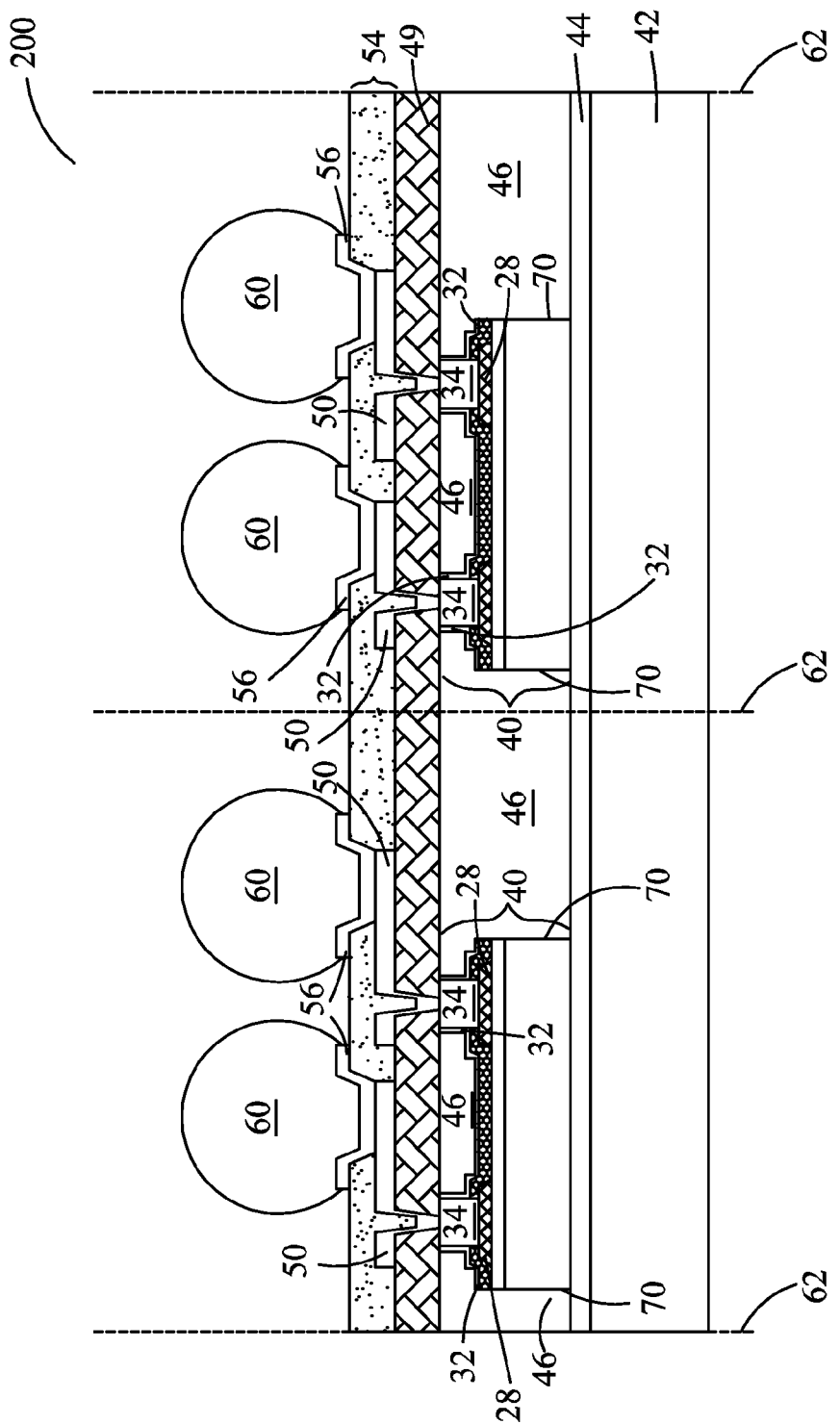

FIG. 6 illustrates the formation of polymer layer 54 (which may be a polyimide layer), under-bump metallurgies (UBMs) 56, and solder balls 60. In an embodiment, polyimide layer 54 is first applied and patterned, so that the PPI pads in PPIs 50 are exposed through the openings in polyimide layer 54. UBMs 56 may then be formed. Solder balls 60 are placed on UBMs 56 and reflowed. Fan-out wafer 200 is thus formed. Wafer 200 includes a plurality of dies 40 and the respective fan-out interconnects. Wafer 200 may be detached from carrier 42, and sawed into a plurality of dies, for example, along scribe lines 62. In the resulting fan-out WLP, dielectric layers 32 are formed on the sidewalls of metal pillars 34, and separate metal pillars 34 from molding compound 46. This may help reduce the diffusion of copper into molding compound 46, and reduce the out-gassing of molding compound 46 from degrading metal pillars 34. The side edges of dielectric layer 32 may be in contact with sidewalls 70 of molding compound 46.

FIGS. 7 through 12 illustrate cross-sectional views of intermediate stages in the manufacturing of a fan-out WLP in accordance with alternative embodiments. Unless specified otherwise, the reference numerals in the following provided alternative embodiments represent like elements in the embodiments illustrated in FIGS. 1 through 6. The initial steps of this embodiment are essentially the same as shown in FIG. 1, except that before wafer 100 is sawed into dies 40, polymer layer (which may be a polyimide layer) 66 is formed over dielectric layer 32. In an embodiment, polyimide layer 66 is formed of high-temperature PBO, although other polyimide materials can also be used. At the time device wafer 100 is sawed, polyimide layer 66 may be the topmost layer that blanket covers the entire device wafer 100. At the time device wafer 100 is sawed, polyimide layer 66 may be exposed to open air. After the sawing of wafer 100 into dies 40, each of dies 40 includes dielectric layer 32, and polyimide layer 66 over dielectric layer 32. Again, in some embodiments, no patterning is performed on polyimide layer 66 and dielectric layer 32 before the die saw.

Figure 8:
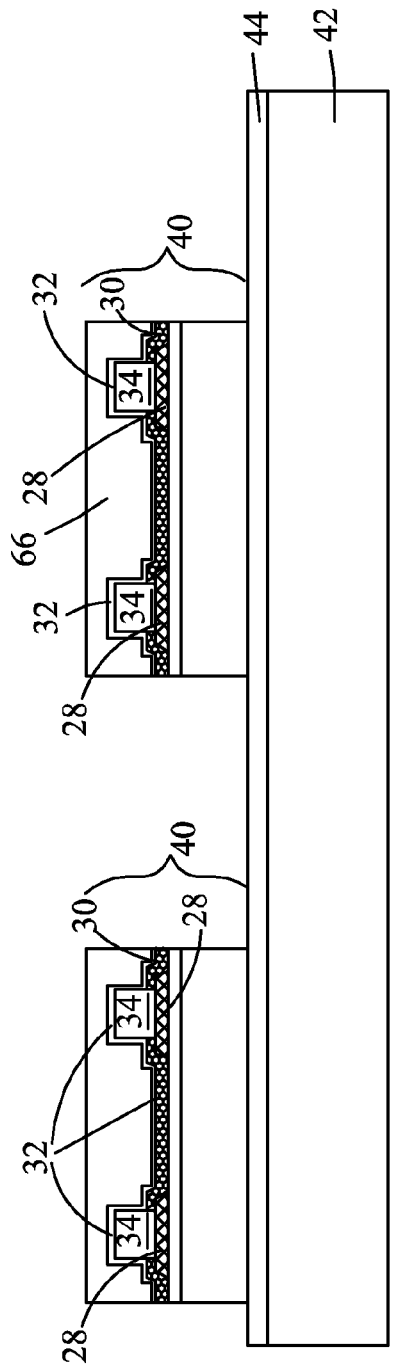
Figure 9:
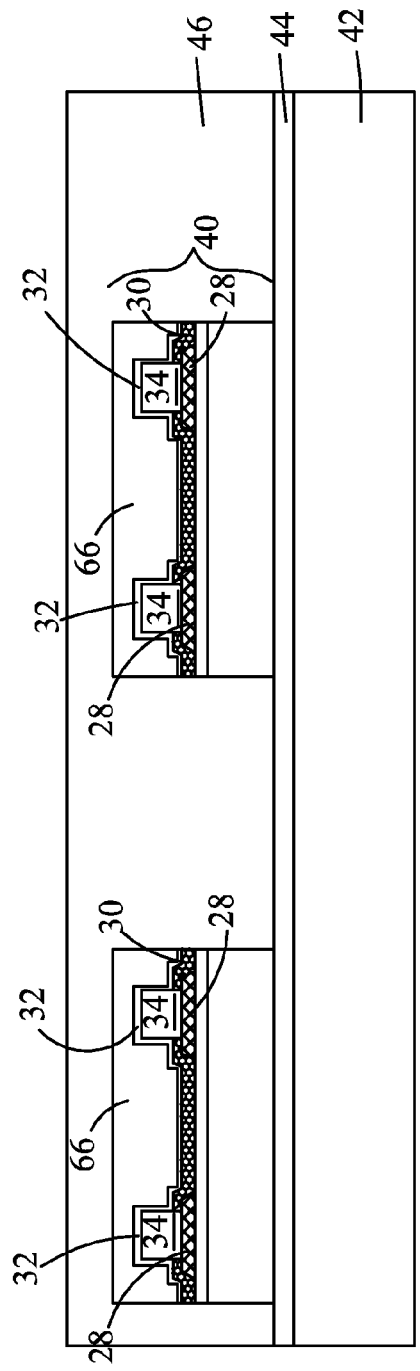
Figure 10:
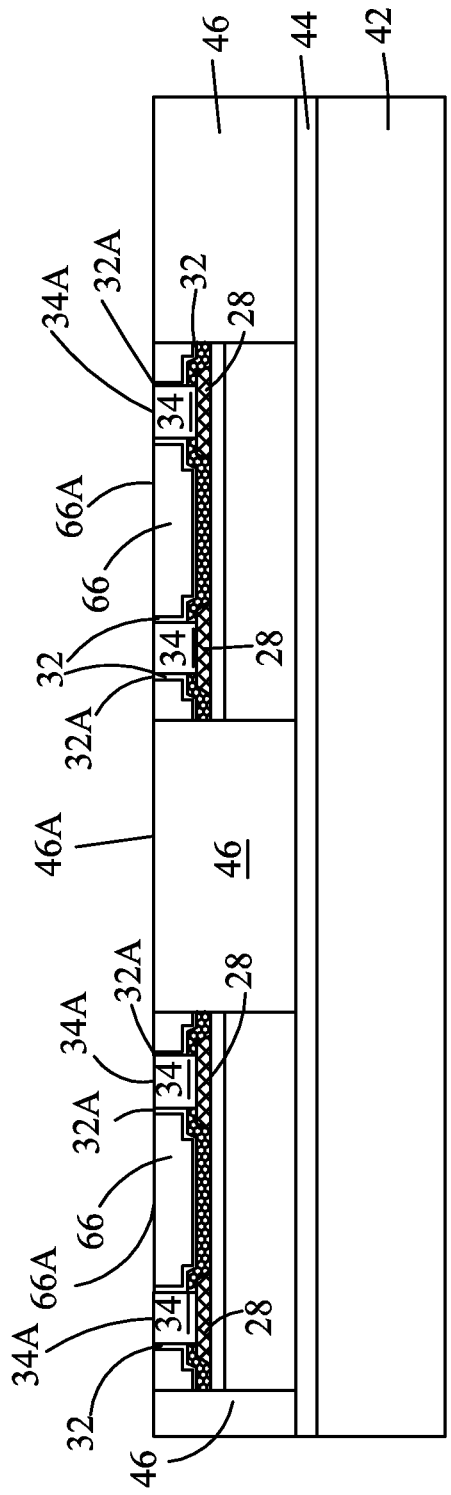
Figure 11:
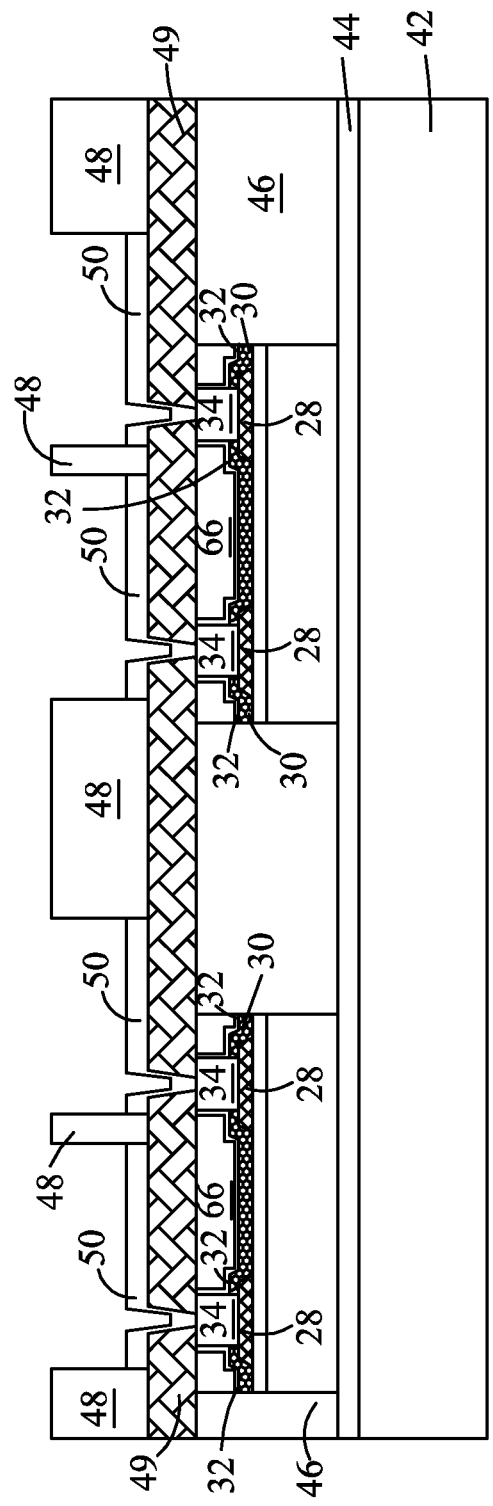
Figure 12:
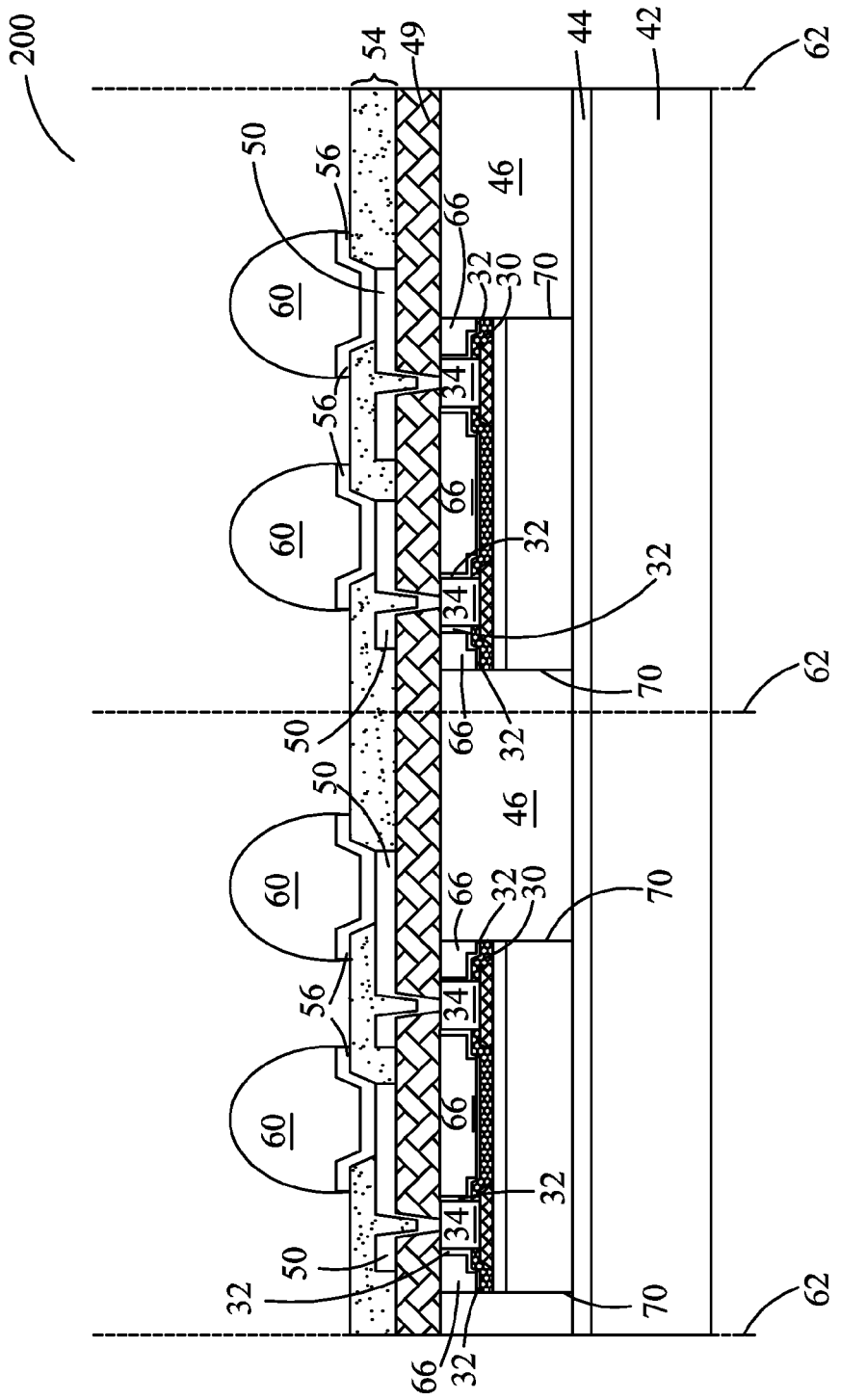

Next, as shown in FIG. 8, dies 40 are placed over and adhered to carrier 42, for example, through adhesive 44. Molding compound 46 is then filled into the gaps between dies 44, and further applied over polyimide layer 66, as shown in FIG. 9. Referring to FIG. 10, after the curing of molding compound 46, a grinding is performed to remove the top portion of molding compound 46, until metal pillars 34 are exposed. As a result, top edges 32A of dielectric layer 32 are level with top surface 46A of molding compound 46, top surfaces 34A of metal pillars 34, and top surfaces 66A of polyimide layer 66. In subsequent process steps, as shown in FIGS. 11 and 12, polymer layer 49, PPIs 50, UBMs 56, polymer layer 54, and solder balls 60 are formed. The formation steps may be essentially the same as shown in FIGS. 5 and 6. The resulting structure is shown in FIG. 12. The formation of fan-out wafer 200 is thus finished. Wafer 200 may then be detached from carrier 42. A die saw may be performed to saw wafer 200 into dies along scribe lines 62.

In the resulting fan-out WLP as shown in FIG. 12, dielectric layers 32 are formed on the sidewalls of metal pillars 34, and separate metal pillars 34 from polyimide layer 66. This may help reduce the inter-diffusion and out-gassing of copper between metal pillars 34 and polyimide layer 66. The structure shown in FIG. 12 differs from the structure in FIG. 6 in that polyimide layers 66, rather than molding compound 46 (with both referred to as package materials), are located directly over dielectric 32 and under polyimide layer 49. Furthermore, polyimide layers 66 are located between metal pillars 34, and are spaced apart from metal pillars 34 by the portions of dielectric layers 32 that are on the sidewalls of metal pillars 34. The side edges of polyimide layers 66, the side edges of passivation layer 30, and the side edges of dielectric layer 32 may be vertically aligned, and contacting, sidewalls 70 of molding compound 46.

Figure 13:
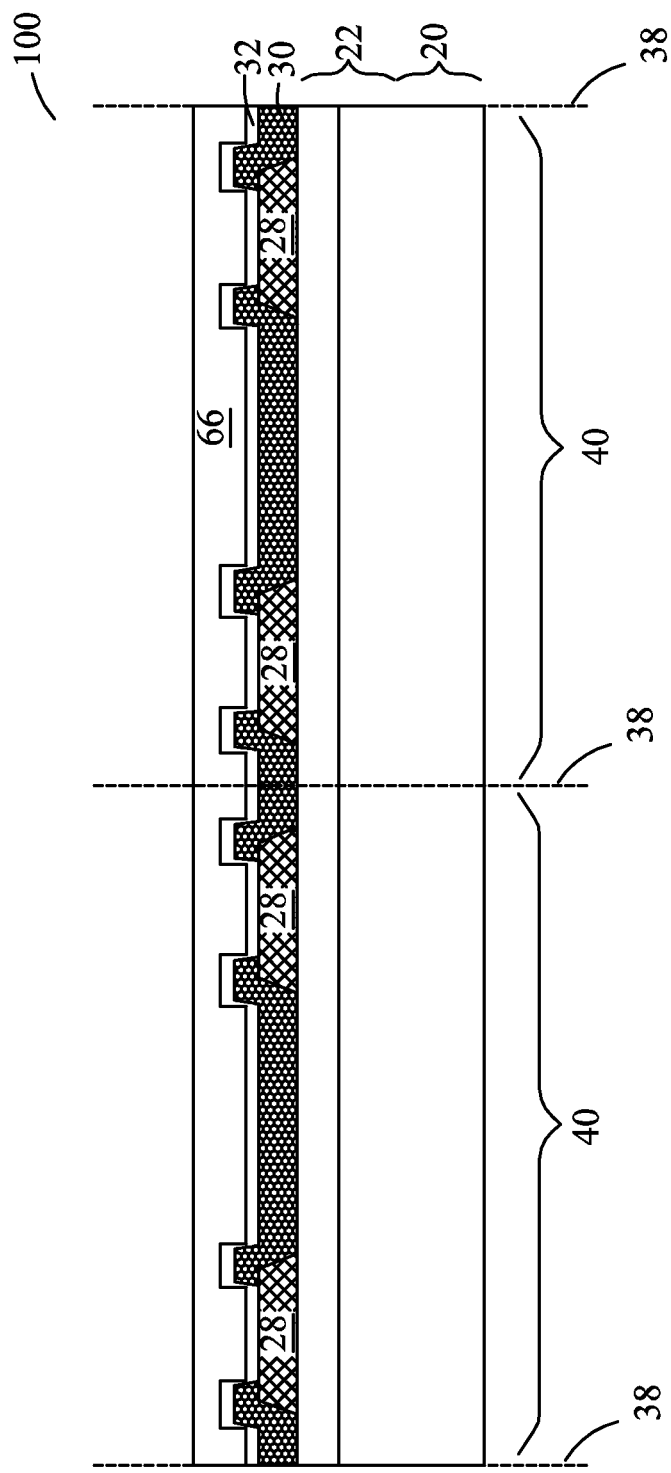

The embodiments as shown in FIGS. 1 through 12 are implemented using via-first approaches, in which metal pillars 34 (which act as vias, FIGS. 1 and 7) are formed before the die-saw processes. FIGS. 13 through 19 illustrate alternative embodiments adopting a via-last approach. Referring to FIG. 13, wafer 100 is formed. The structure as shown in FIG.

Figure 7:
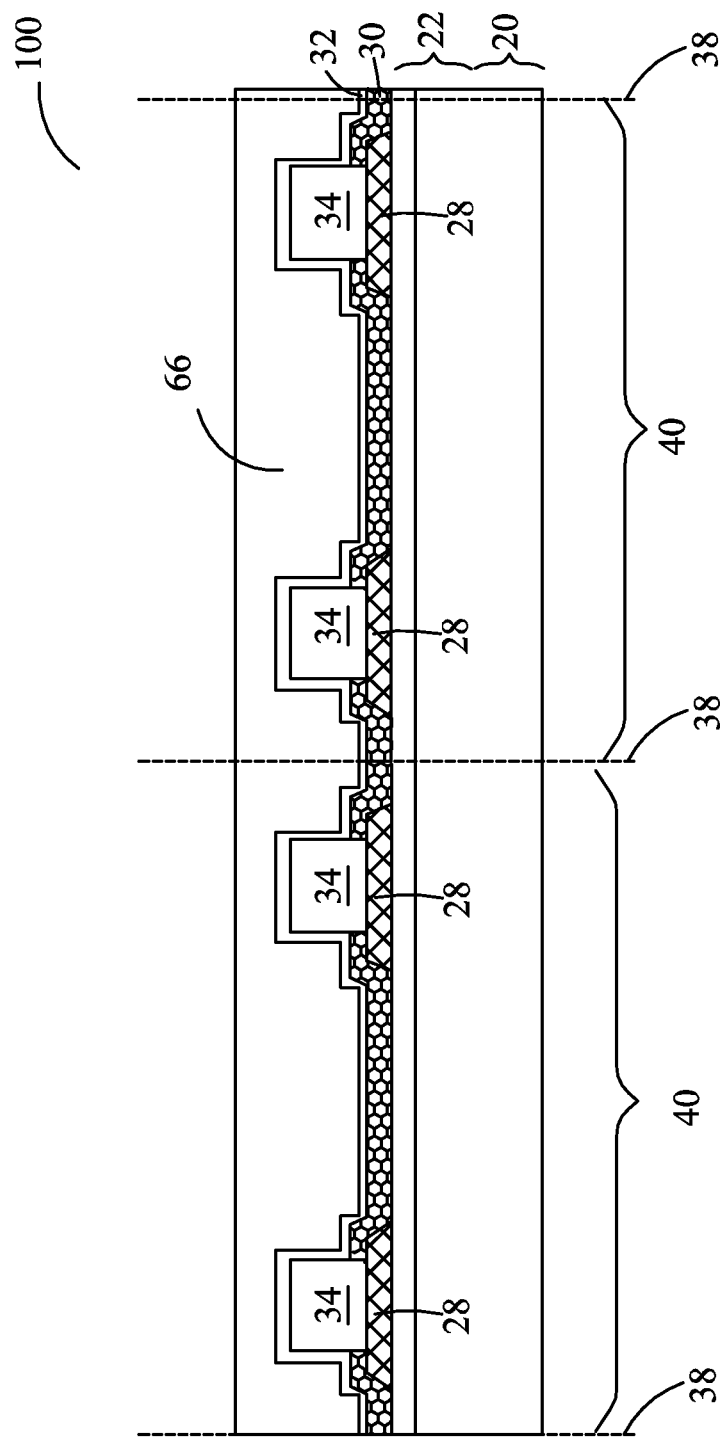
FIGS. 7 through 12 are cross-sectional views of intermediate stages in the manufacturing of a fan-out wafer level package (WLP) in accordance with an alternative embodiment, wherein a dielectric layer and a polyimide layer are formed over the metal pads of a device wafer before the device wafer is sawed, and wherein a via-first approach is used to package the dies sawed from the device wafer.

13 is similar to the structure shown in FIG. 7, except metal pillars 34 are not formed. Dielectric layer 32 is thus formed over passivation layer 30 and metal pads 28. The bottom surface of dielectric layer 32 may contact the top surface of passivation layer 30 and metal pads 28. Furthermore, dielectric layer 32 may extend into the openings in passivation layer 30 to contact metal pads 28. Polymer layer (which may be a polyimide layer) 66 is then formed over dielectric layer 32. In an embodiment, polyimide layer 66 contacts dielectric layer 32. Again, similar to the dielectric layer 32 in FIG. 1, dielectric layer 32 in FIG. 13 may be a conformal layer. Dielectric 32 has a better adhesion with metal pads 28 than polyimide layer 66, and hence may improve the adhesion between polyimide layer 66 and metal pads 28. Wafer 100 is sawed into dies 40 along scribe lines 38.

Figure 16:
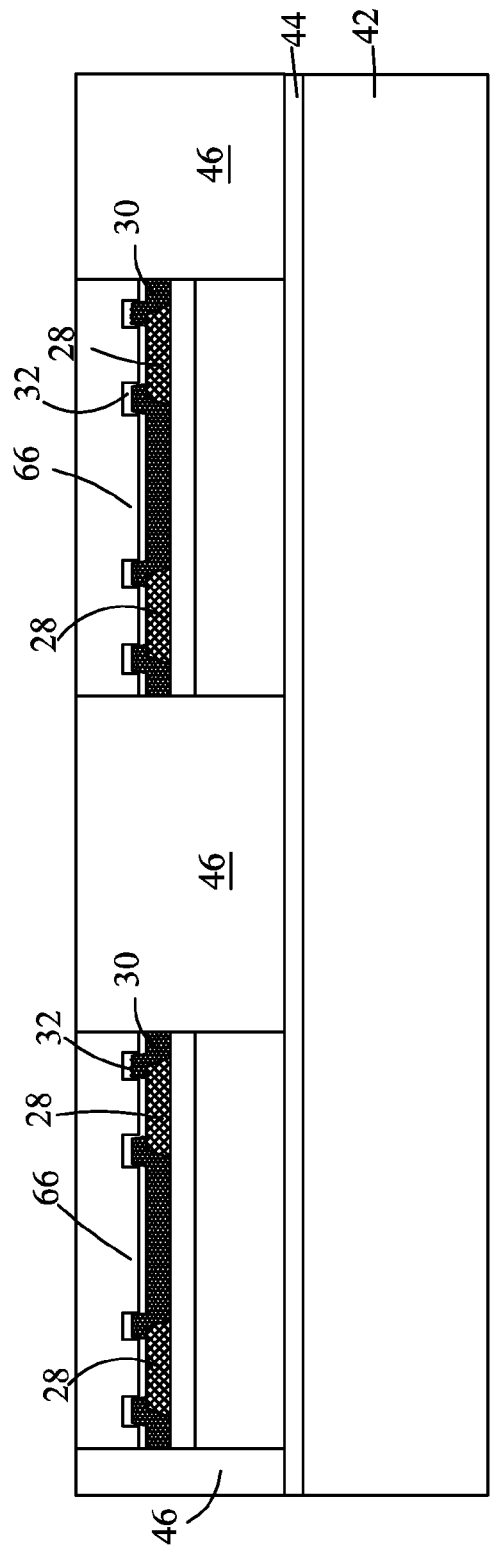
Figure 17:
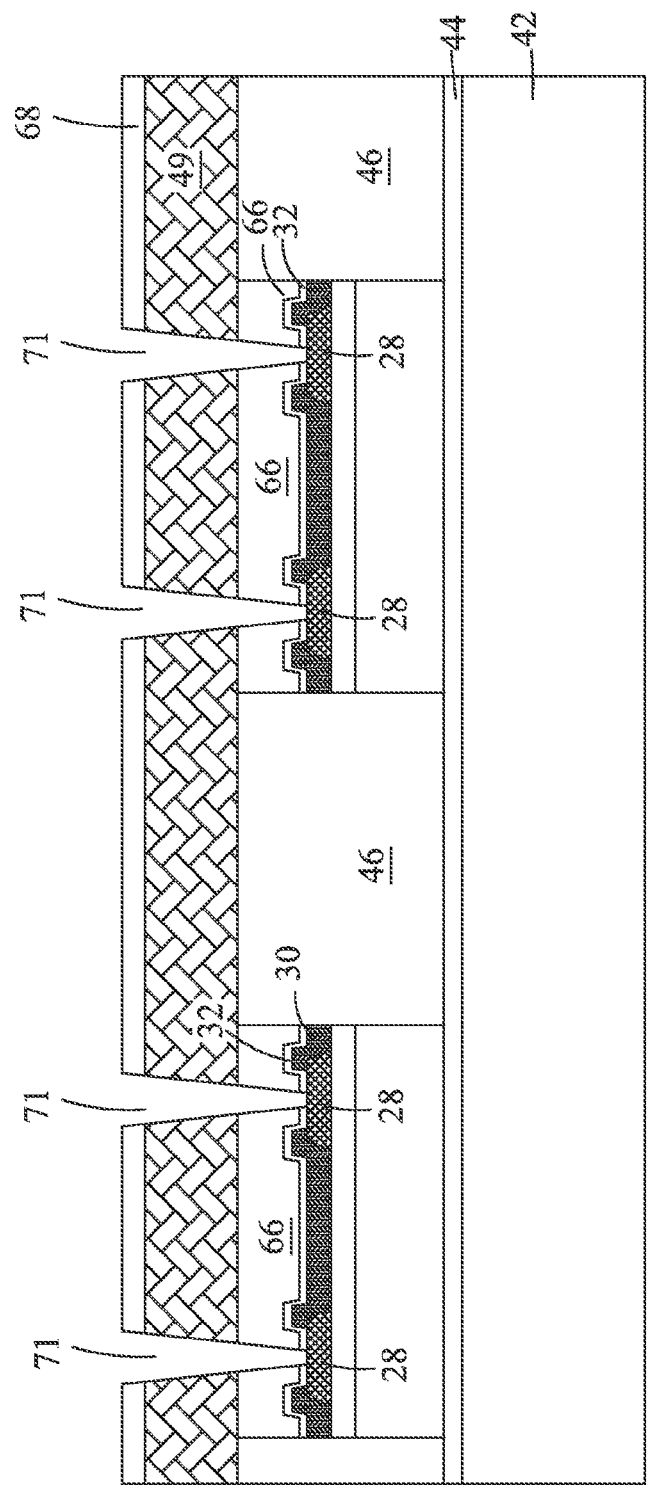

Referring to FIG. 14, dies 40 are attached to carrier 42. Next, as shown in FIG. 15, molding compound 46 is applied into the gaps between dies 40 and over dies 40. Furthermore, molding compound 46 may be applied over polyimide layers 66. FIG. 16 illustrates the grinding of molding compound 46. After the grinding, polyimide layers 66 are exposed, and the top surfaces of polyimide layers 66 are level with the top surface of molding compound 46. Referring to FIG. 17, polyimide layer 49 is formed over polyimide layer 66 and molding compound 46, followed by the formation of hard mask layer 68. In an embodiment, hard mask layer 68 is formed of silicon nitride, although other dielectric materials such as silicon carbide, silicon oxynitride, and the like, may also be used. Hard mask layer 68 is patterned (for example, by using a photo resist (not shown)). Polyimide layers 49 and 66 are then patterned using the patterned hard mask layer 68 to form openings 71. In the formation of openings 71, dielectric layer 32 may be used as an etch stop layer (ESL). The exposed portions of dielectric layer 32 are then etched, and metal pads 28 are exposed.

Figure 18:
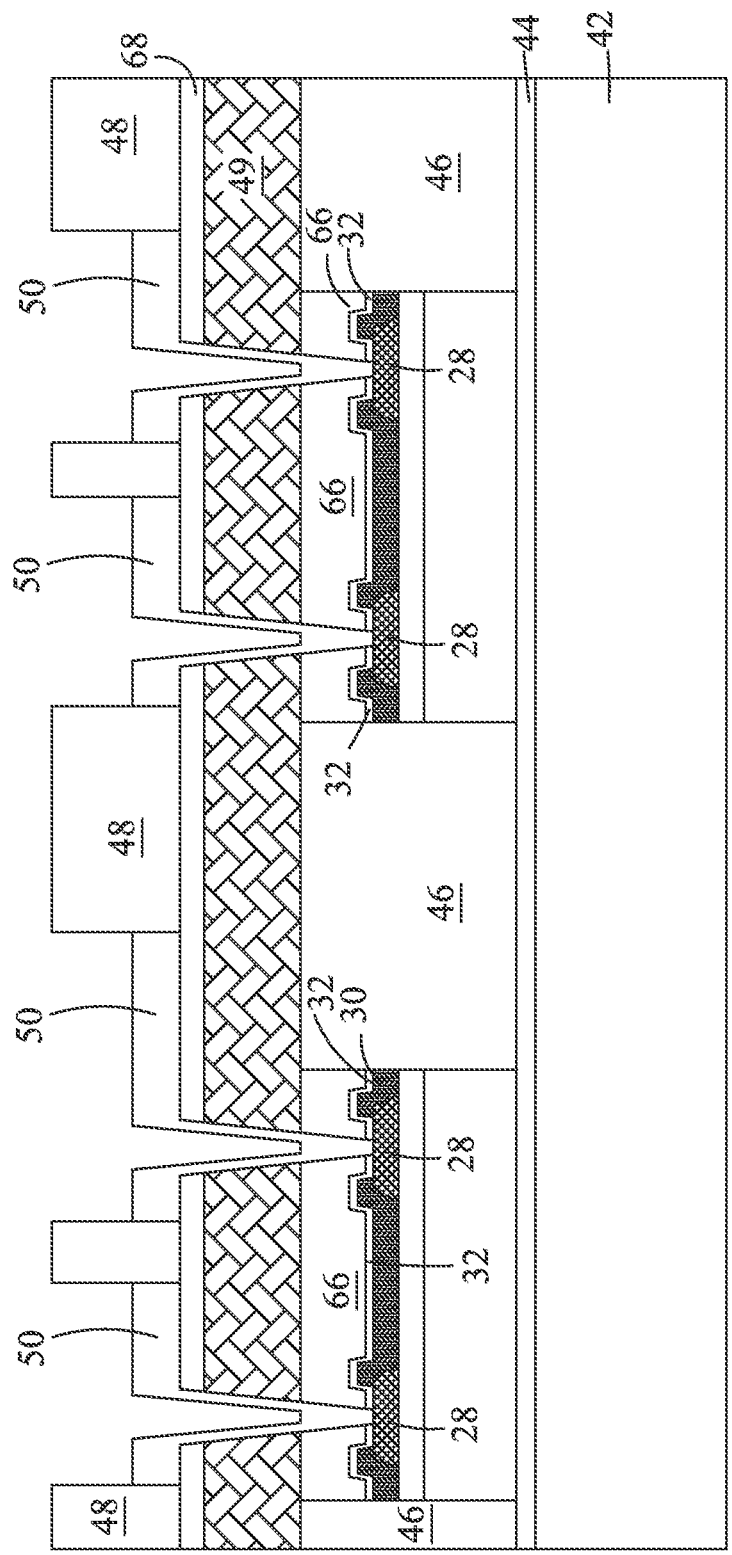
Figure 19:
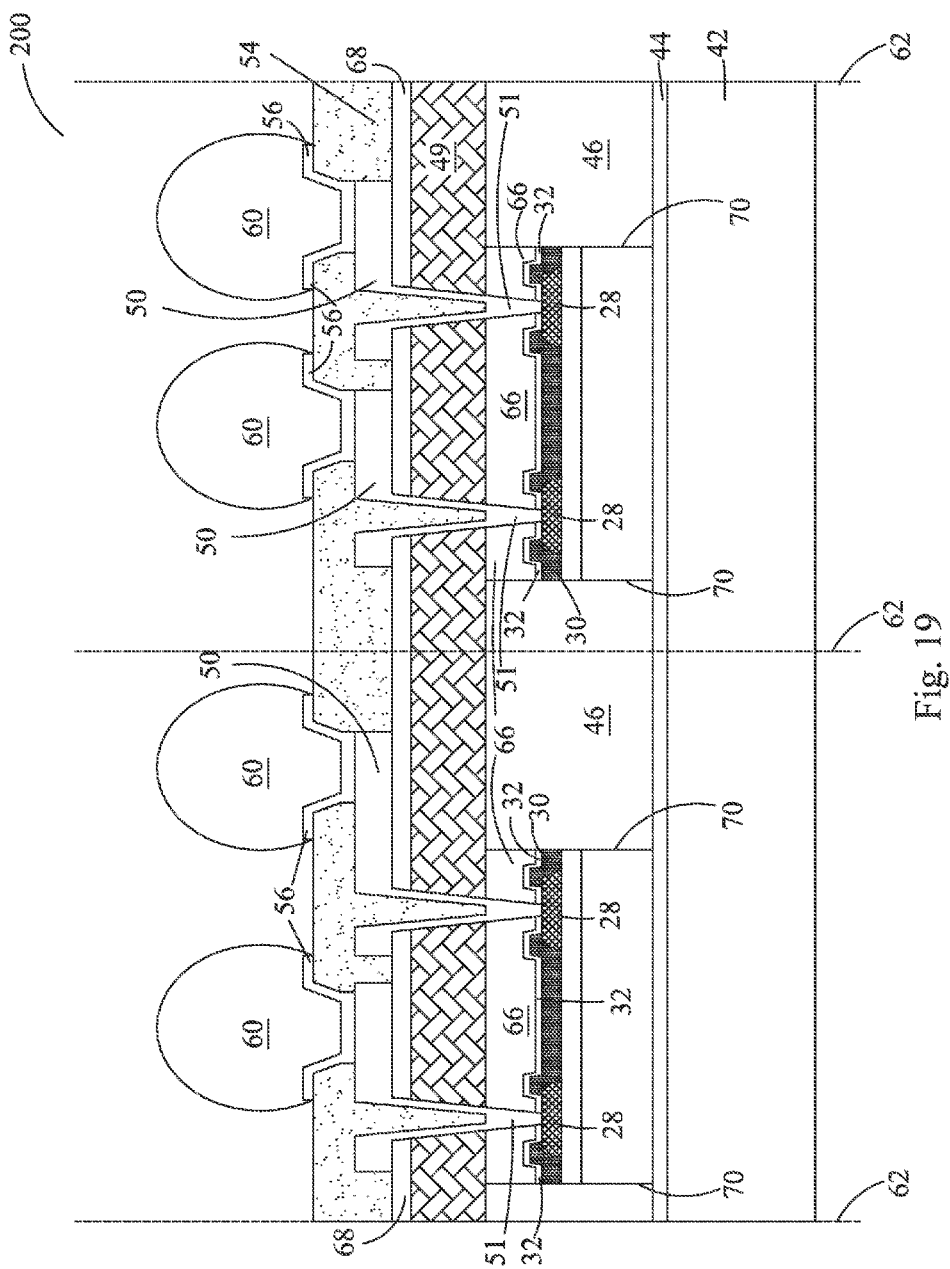

In subsequent process steps, as shown in FIGS. 18 and 19, PPIs 50, polyimide layer 54, UBMs 56, and solder balls 60 are formed. The formation steps may be essentially the same as shown in FIGS. 5 and 6. PPIs 50 include vias 51, which contact the top surfaces of metal pads 28. The resulting structure is shown in FIG. 19. The formation of fan-out wafer 200 is thus finished. Wafer 200 may then be detached from carrier 42. A die saw may be performed to saw wafer 200 into dies along scribe lines 62.

In the resulting fan-out WLP as shown in FIG. 19, dielectric layers 32 comprise portions extending to directly over, and contacting, the top surfaces of, metal pads 28. The portions of dielectric layers 32 that are directly over metal pads 28 may have edges contacting vias 51 of PPIs 50. Polyimide layers 66 are formed between polyimide layer 49 and dielectric layer 32. The side edges of polyimide layers 66, the side edges of passivation layer 30, and the side edges of dielectric layer 32 may be vertically aligned, and contacting, sidewalls 70 of molding compound 46.

In the embodiments, the dielectric layer that is formed before the sawing of device wafers may help reduce the diffusion of copper, reduce the adverse effect of out-gassing, and improve the adhesion.

In accordance with embodiments, a package includes a device die having a substrate. A molding compound contacts a sidewall of the substrate. A metal pad is over the substrate. A passivation layer has a portion covering an edge portion of the metal pad. A metal pillar is over and contacting the metal pad. A dielectric layer is over the passivation layer. A package material formed of a molding compound or a polymer is over the dielectric layer. The dielectric layer includes a bottom portion between the passivation layer and the package material, and a sidewall portion between a sidewall of the metal pillar and a sidewall of the package material. A polymer layer is over the package material, the molding compound, and the metal pillar. A PPI extends into the polymer layer. A solder ball is over the PPI, and is electrically coupled to the metal pad through the PPI.

In accordance with other embodiments, a package includes a device die comprising a substrate; and a molding compound contacting a sidewall of the substrate. A metal pad is over the substrate. A passivation layer has a portion covering an edge portion of the metal pad. A dielectric layer is over the passivation layer, wherein the dielectric layer includes a portion extending into an opening in the passivation layer. The portion of the dielectric layer has a bottom surface contacting a top surface of the metal pad. A first polymer layer is over the dielectric layer, wherein the first polymer layer does not extend to directly over the molding compound. A second polymer layer is over and vertically overlapping the first polymer layer and the molding compound. A PPI includes a via extending into an opening that extends into the first and the second polymer layers, wherein the via contacts a top surface of the metal pad, and wherein an edge of the dielectric layer contacts a sidewall of the via. A solder ball is over the PPI and the second polymer layer, wherein the solder ball is electrically coupled to the metal pad through the PPI.

In accordance with yet other embodiments, a method includes providing a device wafer, wherein the device wafer includes a device die including a substrate, a metal pad over the substrate, and a passivation layer having a portion covering an edge portion of the metal pad, wherein a center portion of a top surface of the metal pad is not covered by the passivation layer. A dielectric layer is blanket formed over the device wafer, wherein the dielectric layer is substantially conformal, and wherein an entirety of the device wafer is covered by the dielectric layer. A die saw is performed on the device wafer to separate the device die from additional dies in the wafer, wherein no patterning is performed to the dielectric layer between the step of blanket forming the dielectric layer and the step of die saw. The device die includes the dielectric layer.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:
1. A package comprising:
   a metal pad over a substrate;
   a passivation layer extending at least partially over the metal pad;

a metal pillar over and electrically coupled to the metal pad;

a dielectric layer over the passivation layer;

a package material over the dielectric layer, wherein the dielectric layer comprises a bottom portion between the passivation layer and the package material, and a sidewall portion between a sidewall of the metal pillar and a sidewall of the package material;

a polymer layer over the package material and the metal pillar; and a post-passivation interconnect (PPI) extending into an opening in the polymer layer and electrically coupled to the metal pillar.

2. The package of claim 1, wherein the bottom portion of the dielectric layer has a first thickness close to a second thickness of the sidewall portion of the dielectric layer.

3. The package of claim 1, wherein the package material comprises a molding compound or a polymer.

4. The package of claim 1, wherein a top surface of the package material, top edges of the dielectric layer, and a top surface of the metal pillar are substantially level with each other.

5. The package of claim 4, further comprising a molding compound on a sidewall of the substrate, wherein a top surface of the molding compound is further level with the top surface of the package material, the top edges of the dielectric layer, and the top surface of the metal pillar.

6. The package of claim 1, wherein the dielectric layer comprises a material selected from a group consisting essentially of silicon nitride, silicon carbide, silicon carbonitride, silicon oxycarbide, tetra-ethyl-ortho-silicate (TEOS) oxide, silicon oxide, and combinations thereof.

7. A package comprising:
a metal pad over a substrate;
a passivation layer comprising a portion covering an edge portion of the metal pad;
a dielectric layer over the passivation layer, wherein a portion of the dielectric layer extends into an opening in the passivation layer, wherein the portion of the dielectric layer contacts the metal pad;
a first polymer layer over the dielectric layer, wherein the dielectric layer is disposed between the metal pad and the first polymer layer; and
a post-passivation interconnect (PPI) comprising a via extending into an opening in the first polymer layer, wherein the via contacts the metal pad.

8. The package of claim 7, further comprising:
a molding compound contacting a sidewall of the substrate, wherein the first polymer layer does not extend over the molding compound; and
a second polymer layer over and vertically overlapping the first polymer layer and the molding compound, wherein the via extends through the second polymer layer into the opening in the first polymer layer.

9. The package of claim 8, wherein the first polymer layer comprises a sidewall contacting a sidewall of the molding compound, wherein the dielectric layer comprises an edge contacting the sidewall of the molding compound, and wherein a top surface of the molding compound is level with a top surface of the first polymer layer.

10. The package of claim 8 further comprising a dielectric hard mask layer over the second polymer layer and under a portion of the PPI.

11. The package of claim 7, wherein an edge of the dielectric layer contacts a sidewall of the via.

12. The package of claim 7, wherein the dielectric layer comprises a material selected from a group consisting essentially of silicon nitride, silicon carbide, silicon carbonitride, silicon oxycarbide, tetra-ethyl-ortho-silicate (TEOS), silicon oxide, and combinations thereof.

13. A package comprising:
a metal feature over a substrate, wherein the metal feature comprises a metal pad;
a passivation layer covering an edge portion of the metal pad;
a dielectric layer over the passivation layer, wherein a portion of the dielectric layer contacts the metal feature;
a packaging material over the dielectric layer, wherein the dielectric layer is disposed between the metal feature and the packaging material; and
a post-passivation interconnect (PPI) comprising a via extending into an opening in the packaging material, wherein the via contacts the metal pad.

14. The package of claim 13, wherein metal feature further comprises a metal pillar over and electrically coupled to the metal pad, wherein the dielectric layer is disposed on a sidewall of the metal pillar between the sidewall of the metal pillar and the packaging material.

15. The package of claim 13, wherein the dielectric layer is disposed on a top surface of the passivation layer, wherein the dielectric layer is disposed between the passivation layer and the packaging material.

16. The package of claim 15, wherein a first portion of the dielectric layer between the passivation layer and the packaging material has a first thickness, wherein a second portion of the dielectric layer between the metal feature and the packaging material has a second thickness, and wherein the second thickness is substantially equal to the first thickness.

17. The package of claim 13, wherein the package material comprises a molding compound or a polymer.

18. The package of claim 13, wherein a top surface of the package material, top edges of the dielectric layer, and a top surface of the metal feature are substantially level with each other.

19. The package of claim 13, wherein the dielectric layer comprises a material selected from a group consisting essentially of silicon nitride, silicon carbide, silicon carbonitride, silicon oxycarbide, tetra-ethyl-ortho-silicate (TEOS), silicon oxide, and combinations thereof.

20. The package of claim 13 further comprising a solder ball over the PPI and electrically coupled to the PPI.

* * * * *